US010211797B2

(12) United States Patent
Roderick

(10) Patent No.: US 10,211,797 B2
(45) Date of Patent: Feb. 19, 2019

(54) BIDIRECTIONAL AMPLIFIER

(71) Applicant: Teledyne Scientific & Imaging, LLC, Thousand Oaks, CA (US)

(72) Inventor: Jonathan Roderick, Thousand Oaks, CA (US)

(73) Assignee: TELEDYNE SCIENTIFIC & IMAGING, LLC, Thousand Oaks, CA (US)

( * ) Notice: Subject to any disclaimer, the term of this patent is extended or adjusted under 35 U.S.C. 154(b) by 0 days.

(21) Appl. No.: 15/646,991

(22) Filed: Jul. 11, 2017

(65) Prior Publication Data

US 2018/0019719 A1    Jan. 18, 2018

Related U.S. Application Data

(60) Provisional application No. 62/361,308, filed on Jul. 12, 2016.

(51) Int. Cl.
*H03F 1/22* (2006.01)
*H03F 3/62* (2006.01)
*H03G 1/00* (2006.01)

(52) U.S. Cl.
CPC ................. *H03F 3/62* (2013.01); *H03F 1/22* (2013.01); *H03G 1/0023* (2013.01); *H03F 2200/75* (2013.01)

(58) Field of Classification Search
CPC ... H03F 3/62; H03F 1/22; H03F 1/223; H03F 1/226

USPC .......................................... 330/311; 379/395
See application file for complete search history.

(56) References Cited

U.S. PATENT DOCUMENTS

| | | | |
|---|---|---|---|
| 3,519,765 A | 7/1970 | Huber | |
| 4,595,803 A | 6/1986 | Wright | |
| 4,695,740 A | 9/1987 | Carter | |
| 4,758,822 A | 7/1988 | Greaby et al. | |
| 5,724,344 A * | 3/1998 | Beck | H04B 3/10 330/52 |
| 5,821,813 A | 10/1998 | Batchelor et al. | |
| 7,737,786 B2 * | 6/2010 | Plaze | H03F 1/223 330/301 |
| 8,190,099 B2 * | 5/2012 | Berg | H03F 1/56 330/277 |

* cited by examiner

*Primary Examiner* — Steven J Mottola
(74) *Attorney, Agent, or Firm* — M. J. Ram and Associates

(57) ABSTRACT

A bidirectional amplifier includes first and second ports, with a first summing node connected to the first port and a second summing node connected to the second port. First and second gain stages are connected between the first and second summing nodes, respectively, and a first node. First and second feedback stages are also connected between the first and second summing nodes, respectively, and the first node. The amplifier operates in a first mode in which an amplified version of a signal applied to the first port is provided at the second port, or a second mode in which an amplified version of a signal applied to the second port is provided at the first port. The first and second gain stages are preferably first and second common emitter cascode arrangements, and the first and second feedback stages are preferably first and second emitter followers.

25 Claims, 3 Drawing Sheets

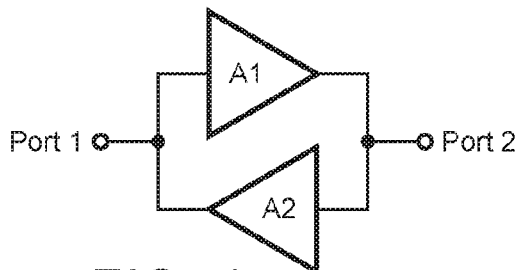
FIG. 1
PRIOR ART
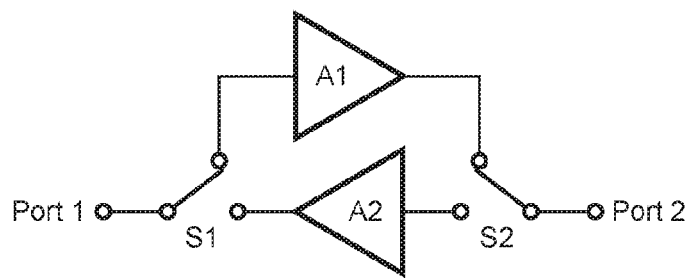
FIG. 2
PRIOR ART
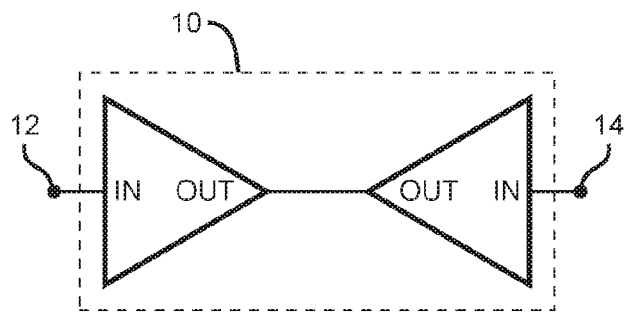
FIG. 3
FIG. 4
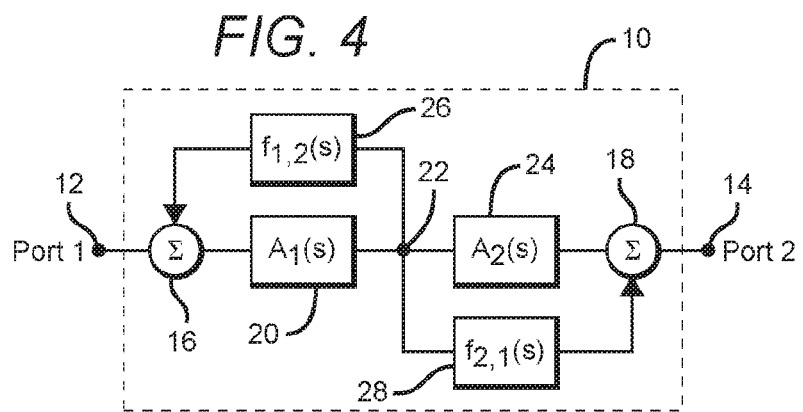

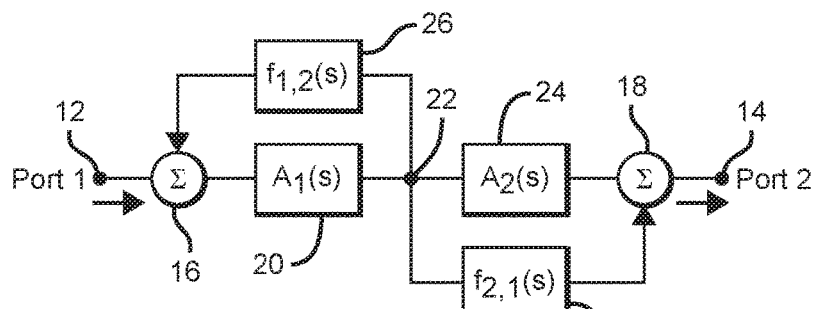
FIG. 5a
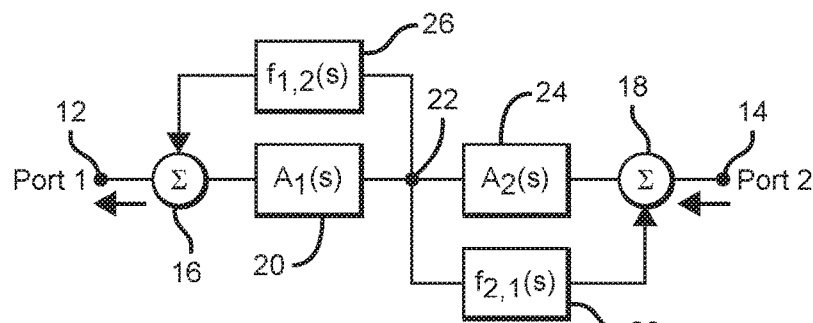
FIG. 5b
FIG. 6
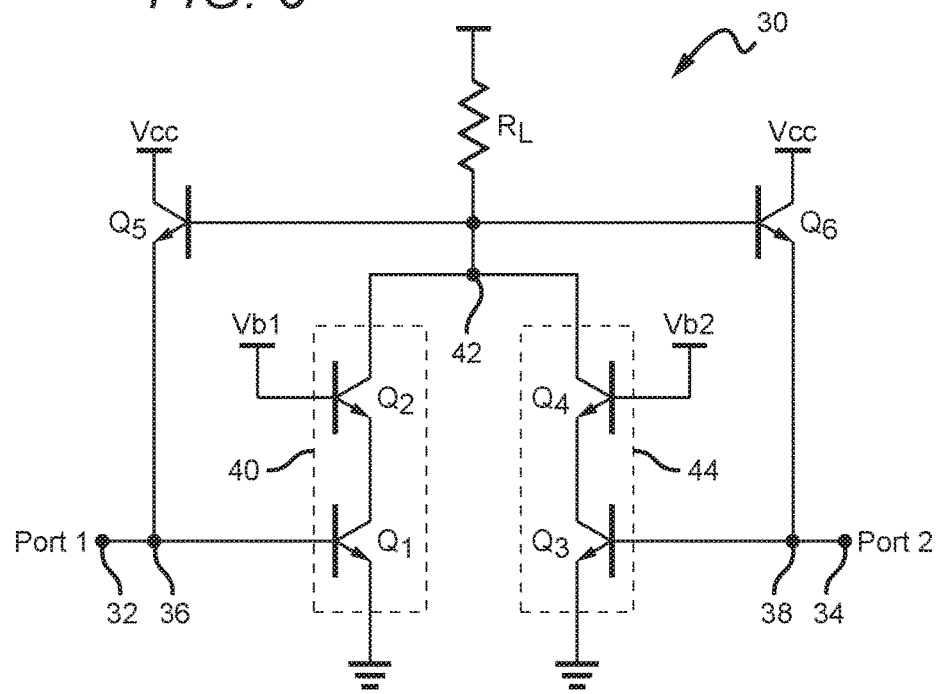

BIDIRECTIONAL AMPLIFIER

RELATED APPLICATIONS

This application claims the benefit of provisional patent application No. 62/361,308 to Jonathan Roderick, filed Jul. 12, 2016.

BACKGROUND OF THE INVENTION

Field of the Invention

This invention relates generally to amplifiers, and more particularly to circuits capable of providing amplification bidirectionally.

Description of the Related Art

There are a number of applications in which bilateral signal amplification is desirable or necessary. For example, communication and radar systems commonly use both transmit and receive architectures to provide this functionality.

One way to provide bidirectional amplification is with the use of two opposing amplifiers; this is illustrated in FIG. 1. Here, a first amplifier A1 provides amplification between a first port PORT 1 and a second port PORT 2, and a second amplifier A2 provides amplification between PORT 2 and PORT 1. In operation, either A1 or A2 is powered on or enabled, depending on the desired amplification direction.

Another approach is shown in FIG. 2. Here, rather than require that the two opposing amplifiers be powered on or enabled, the direction of amplification is determined by two SPDT switches S1 and S2. When S1 and S2 are connected in the 'up' position as shown in FIG. 2, amplifier A1 provides amplification between PORT 1 and PORT 2; similarly, when S1 and S2 are in the 'down' position, amplifier A2 provides amplification between PORT 2 and PORT 1.

However, the two-opposing-amplifier approach shown in FIGS. 1 and 2 significantly increase system integration complexity, design layout footprint, and cost due to parts count. In addition, mismatch between the two amplifiers and the two switches (if used) is inevitable, as are switch-related losses; these inherent flaws diminish achievable system performance and are likely to result in signal processing error.

SUMMARY OF THE INVENTION

A bidirectional amplifier is presented which overcomes some of the problems discussed above, without increasing the design layout footprint. The architecture allows real-time in situ swapping of the input and output, and makes possible the reuse of common components in, for example, communication systems that perform both transmit and receive functions.

The present amplifier comprises first and second ports, with a first summing node connected to the first port and a second summing node connected to the second port. A first gain stage is connected between the first summing node and a first node, and a second gain stage is connected between the second summing node and the first node. A first feedback stage is connected between the first node and the first summing node, and a second feedback stage is connected between the first node and the second summing node. The bidirectional amplifier is arranged to operate in either a first mode in which an amplified version of a signal applied to the first port is provided at the second port, or a second mode in which an amplified version of a signal applied to the second port is provided at the first port.

Specifically, in the first mode:
  the first port is an input port and the second port is an output port;
  the first summing node produces an output which varies with the difference between a signal applied to the first port and the output of the first feedback stage;
  the first gain stage provides an output which varies with the first summing node output;
  the second feedback stage receives the output of the first gain stage; and
  the second summing node receives the output of the second feedback stage (here operating as a follower stage) and produces an output at the second port which varies with the second feedback stage output.

And in the second mode:
  the second port is an input port and the first port is an output port;
  the second summing node produces an output which varies with the difference between a signal applied to the second port and the output of the second feedback stage;
  the second gain stage provides an output which varies with the second summing node output;
  the first feedback stage receives the output of the second gain stage; and
  the first summing node receives the output of the first feedback stage (here operating as a follower stage) and produces an output at the first port which varies with the first feedback stage output.

The first and second gain stages preferably comprise first and second common emitter cascode arrangements, respectively, and the first and second feedback stages preferably comprise first and second emitter followers, respectively. In the first mode, the first gain stage is enabled and the second gain stage is adjusted according to system requirements or disabled, the first feedback stage provides feedback from the output of the first gain stage to the first summing node, and the second feedback stage operates as an emitter follower stage. In the second mode, the second gain stage is enabled and the first gain stage is adjusted according to system requirements or disabled, the second feedback stage provides feedback from the output of the second gain stage to the second summing node, and the first feedback stage operates as an emitter follower stage.

These and other features, aspects, and advantages of the present invention will become better understood with reference to the following drawings, description, and claims.

BRIEF DESCRIPTION OF THE DRAWINGS

FIG. 1 is a schematic of a known bidirectional amplifier.
FIG. 2 is a schematic of a known bidirectional amplifier.
FIG. 3 illustrates the general concept for a bidirectional amplifier in accordance with the present invention.
FIG. 4 is a block diagram of one possible embodiment of a bidirectional amplifier in accordance with the present invention.
FIGS. 5a and 5b are block diagrams which illustrate the operation of the bidirectional amplifier of FIG. 4 when amplifying from PORT 1 to PORT 2, and from PORT 2 to PORT 1, respectively.
FIG. 6 is a schematic diagram of one possible implementation of a bidirectional amplifier in accordance with the present invention.

DETAILED DESCRIPTION OF THE INVENTION

Figure 7:
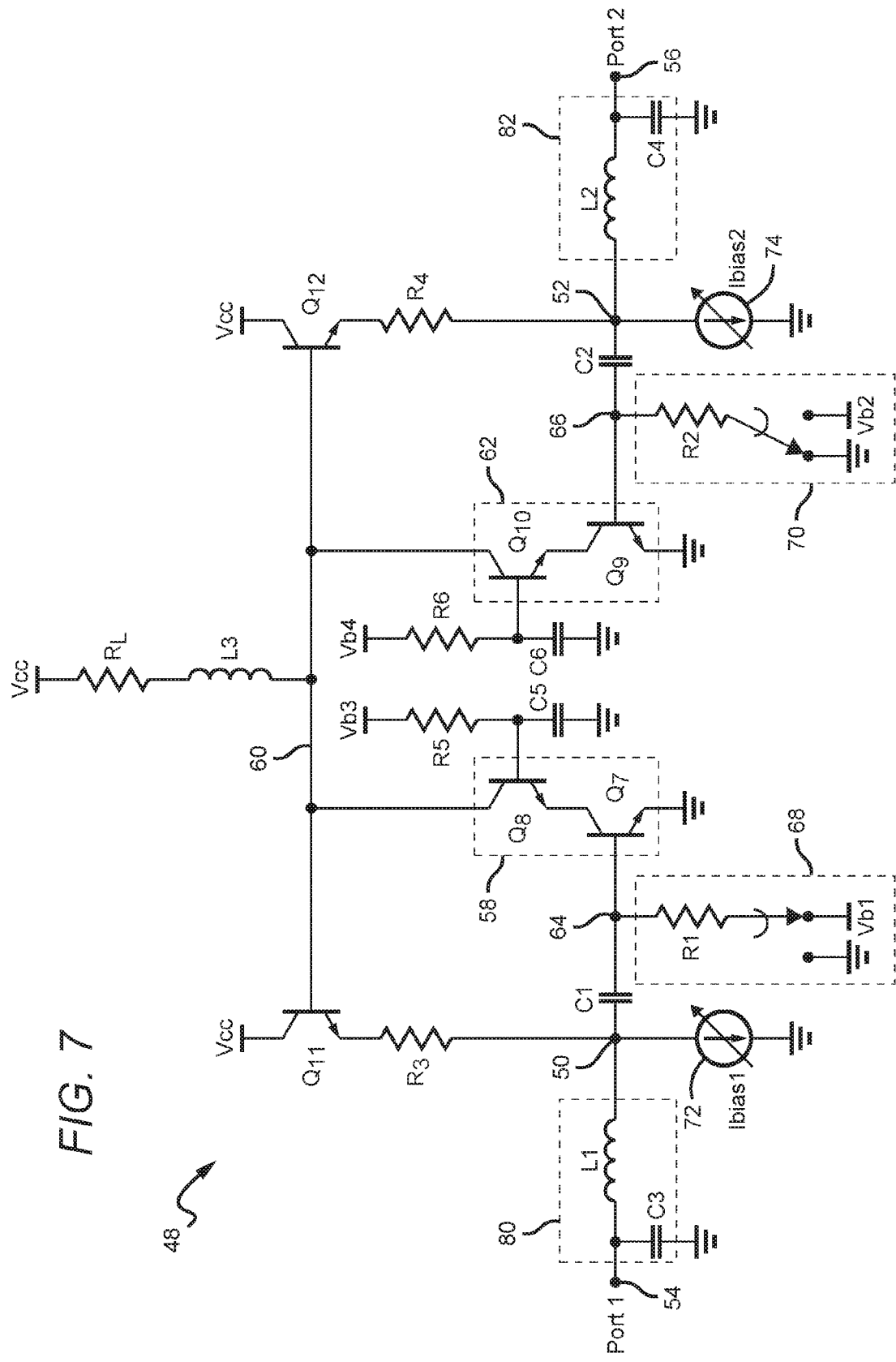
FIG. 7 is a more detailed schematic diagram of one possible implementation of a bidirectional amplifier in accordance with the present invention.

The general concept for a bidirectional amplifier in accordance with the present invention is shown in FIG. 3. The bidirectional amplifier 10 comprises a first port 12 and a second port 14. The bidirectional amplifier operates in two modes. In a first mode, port 12 is an input port and port 14 is an output port, with the signal provided by the amplifier to output port 14 being proportional to a signal provided to the amplifier at input port 12. Similarly, in a second mode, port 14 is an input port and port 12 is an output port, with the signal provided by the amplifier to output port 12 being proportional to a signal provided to the amplifier at input port 14. A means of switching the bidirectional amplifier between first and second modes would preferably be provided.

A block diagram of one possible embodiment of the present bidirectional amplifier is shown in FIG. 4. As above, the bidirectional amplifier 10 includes a first port 12 and a second port 14. A first summing node 16 is connected to first port 12, and a second summing node 18 is connected to second port 14. A first gain stage 20 is connected between first summing node 16 and a first node 22, and a second gain stage 24 is connected between second summing node 18 and first node 22. A first feedback stage 26 is connected between first node 22 and first summing node 16, and a second feedback stage 28 connected between the first node and second summing node 18.

The 'first mode' operation of bidirectional amplifier 10 is illustrated in FIG. 5a, as follows:
first port 12 is an input port and second port 14 is an output port;
first summing node 16 produces an output which varies with the difference between a signal applied to first port 12 and the output of first feedback stage 26;
first gain stage 20 provides an output which varies with the output of first summing node 16;
second feedback stage 28 receives the output of first gain stage 20; and
second summing node 18 receives the output of second feedback stage 28 and produces an output at second port 14 which varies with the output of the second feedback stage, thereby providing amplification from left-to-right. Here, second feedback stage 28 operates as a follower stage, and second gain stage 24 is adjusted according to system requirements or is disabled. The magnitude and/or phase of gain stages 20 and 24 may be varied in-situ or during steady-state operation to meet the requirements of application specific systems.

The 'second mode' operation of bidirectional amplifier 10 is illustrated in FIG. 5b, as follows:
second port 14 is an input port and first port 12 is an output port;
second summing node 18 produces an output which varies with the difference between a signal applied to second port 14 and the output of second feedback stage 28;
second gain stage 24 provides an output which varies with the output of second summing node 18;
first feedback stage 26 receives the output of second gain stage 24; and
first summing node 16 receives the output of first feedback stage 26 and produces an output at first port 12 which varies with the output of the first feedback stage, thereby providing amplification from right-to-left. Here, first feedback stage 26 operates as a follower stage, and first gain stage 20 is adjusted according to system requirements or is disabled. The magnitude and/or phase of gain stages 20 and 24 may be varied in-situ or during steady-state operation to meet the requirements of system application specific systems.

First and second gain stages 20 and 24 have associated gain transfer functions A1($s$) and A2($s$), respectively, and first and second feedback stages 26 and 28 have associated feedback transfer functions f1,2($s$) and f2,1($s$), respectively. A1($s$) and A2($s$) can be identical or different. For example, both functions can be narrowband, both wideband, one narrowband and the other wideband, etc. Feedback stage functions f1,2($s$) and f2,1($s$) can be identical or different, symmetric or asymmetric, etc., and can be implemented with specific functions to provide desired effects. For example, gain-peaking zeroes can be placed in the feedback stage functions, to obtain an overall flatter gain response over frequency for the amplifier. These functions can impact various amplifier characteristics, such as the overall amplifier gain, as well as the port impedances. A bidirectional amplifier as described herein can be implemented using nearly any circuit technology, including solid-state circuitry such as BJTs, HBTs, or CMOS FETs, vacuum tubes, etc.

With respect to FIGS. 4, 5a, and 5b, the term "feedback" is intended to encompass both feedback and follower functions. For example, in the "first mode", first feedback stage 26 provides a feedback function and second feedback stage 28 provides a follower function, while in the "second mode", the first feedback stage provides a follower function and the second feedback stage provides a feedback function.

In practice, the present bidirectional amplifier has circuitry connected between first and second ports which is arranged to, in a first mode, amplify a signal applied at the first port and provide the amplified signal at the second port, and in a second mode, amplify a signal applied at the second port and provide the amplified signal at the first port. An exemplary, basic implementation of a bidirectional amplifier 30 per the present invention is shown in FIG. 6. The amplifier's circuitry comprises first and second ports 32 and 34, coupled to first and second nodes 36 and 38, respectively. First and second transistors Q1 and Q2 are connected in a first common emitter cascode arrangement 40 between first node 36 and a third node 42, and third and fourth transistors Q3 and Q4 are connected in a second common emitter cascode arrangement 44 between second node 38 and third node 42. A fifth transistor Q5 is connected between third node 42 and first node 36, and a sixth transistor Q6 is connected between third node 42 and second node 38. An AC load resistor ($R_L$) would typically be connected between third node 42 and the supply voltage.

As noted above, the bidirectional amplifier 30 operates in first and second modes. In the first mode, first common emitter cascode arrangement 40 is enabled and second common emitter cascode arrangement 44 is adjusted according to system requirements (as discussed above) or disabled. Sixth transistor Q6 operates as an emitter follower and forms a gain stage with first common emitter cascode arrangement 40, and fifth transistor Q5 operates as a feedback emitter follower, such that bidirectional amplifier 30 amplifies a signal applied to first port 32 and provides the amplified signal at second port 34. As shown, the bases of Q2 and Q4 are tied to DC bias points, which are AC grounds (zero impedance at the frequency of interest). A finite impedance maybe introduced at the base of Q2 and/or Q4 to produce a desired transfer function.

In the second mode, second common emitter cascode arrangement 44 is enabled and first common emitter cascode arrangement 40 is adjusted according to system requirements or is disabled. Fifth transistor Q5 operates as an emitter follower and forms a gain stage with second common emitter cascode arrangement 44, and sixth transistor Q6 operates as a feedback emitter follower, such that bidirectional amplifier 30 amplifies a signal applied to second port 34 and provides the amplified signal at first port 32. As above, the bases of Q2 and Q4 are tied to DC bias points/AC grounds. A finite impedance maybe introduced at the base of Q2 and/or Q4 to produce a desired transfer function.

The present bidirectional amplifier may be realized with only a few components more than that needed to implement a single amplifier. This improves system loss and drastically lowers the required layout real estate compared to an implementation which uses two amplifiers. Also, utilizing a single amplifier as described herein reduces undesired mismatch inherent with a two amplifier solution. The novel bidirectional amplifier is a preferably a single, symmetrical architecture, which eliminates losses associated with switches, signal processing error resulting from component mismatch, and additional overhead—all of which might be incurred with a two amplifier approach.

As noted above, the present novel circuit topology allows for bidirectional amplification without significantly increasing the design layout footprint required for a unidirectional amplifier. The architecture allows real-time in situ swapping of the input and output. This allows for the reuse of common components and key system resources in, for example, communication systems that perform both transmit and receive functions. The bidirectional amplifier described herein is useful with any application that requires electrical signals that need to move in a bidirectional manner. Beamforming radar and fiber optic communications are exemplary applications.

A detailed implementation of a preferred embodiment of the present bidirectional amplifier is shown in FIG. 7. As in FIG. 6, the bidirectional amplifier 48 comprises first and second nodes 50, 52 coupled to first and second ports 54, 56, respectively, first and second transistors Q7, Q8 connected in a first common emitter cascode arrangement 58 between first node 50 and a third node 60, third and fourth transistors Q9, Q10 connected in a second common emitter cascode arrangement 62 between second node 52 and third node 60, a fifth transistor Q11 connected between third node 60 and first node 50, and a sixth transistor Q12 connected between third node 60 and second node 52.

There are numerous ways in which the amplifier can be toggled between its first and second operating modes; one possibility is to have first and second bias points coupled to the first and second common emitter cascode arrangements, respectively, and arranged such that they can selectively enable or disable the first and second common emitter cascode arrangements. This is illustrated in FIG. 7, in which a first bias point 64 is coupled to first common emitter cascode arrangement 58, and a second bias point 66 is coupled to second common emitter cascode arrangement 62. First and second common emitter cascode arrangements 58 and 62 can be enabled, disabled, or adjusted according to system requirements (as discussed above) by controlling the voltages at bias points 64 and 66.

The bias point voltages can be established in any number of different ways. For example, first and second bias points 64 and 66 can be set to respective voltages with one or more digital-to-analog converters (DACs). Another possible method by which the voltages at bias points 64 and 66 can be set is with first and second switches, respectively; this method is illustrated in FIG. 7. Here, a first switch 68 is arranged to connect the input to first common emitter cascode arrangement 58 to either a circuit common point or to a first bias voltage Vb1 (preferably via a resistor R1), such that the first common emitter cascode arrangement is enabled when switch 68 connects bias point 64 to Vb1, and is disabled when switch 68 connects bias point 64 to a circuit common point (such as ground). Similarly, a second switch 70 is arranged to connect the input to second common emitter cascode arrangement 62 to either a circuit common point or to a second bias voltage Vb2 (preferably via a resistor R2), such that the second common emitter cascode arrangement is enabled when switch 70 connects bias point 66 to Vb2, and is disabled when switch 70 connects bias point 66 to a circuit common point (such as ground).

In operation, switches 68 and 70 would be operated in complementary fashion. In the amplifier's first mode, in which port 1 (54) is the input and port 2 (56) is the output, switch 68 connects bias point 64 to Vb1 and switch 70 connects bias point 66 to circuit common, thereby enabling first common emitter cascode arrangement 58 and disabling second common emitter cascode arrangement 62. In the amplifier's second mode, in which port 1 (54) is the output and port 2 (56) is the input, switch 68 connects bias point 64 to circuit common and switch 70 connects bias point 66 to Vb2, thereby enabling second common emitter cascode arrangement 62 and disabling first common emitter cascode arrangement 58. Note that Vb1 and Vb2 would typically be equal, though this is not essential. Bias voltages Vb1 and Vb2 set the current density through the first amplification stage (input), which in turn sets the open loop gain of the first amplification section. The current density can also be used to adjust other performance metrics of the amplifier, such as unity gain frequency, etc. Just as with any amplifier, the device bias in the gain stage may be used to adjust gain and frequency response.

A bidirectional amplifier as shown in FIG. 7 preferably includes a first current source 72 which conducts a bias current Ibias1 connected between first node 50 and a circuit common point, and a second current source 74 which conducts a bias current Ibias2 connected between second node 52 and the circuit common point. Ibias1 and Ibias2 may be equal or different. In one embodiment, with the amplifier operating in its first mode, Ibias1 can be equal to a value x and Ibias2 equal to a value y, and then when operating in its second mode, Ibias1 becomes equal to y and Ibias2 becomes equal to x. First and second current sources can be implemented in any of a number of different ways; for example, respective DACs could be used to provide Ibias1 and Ibias2. The exact values of Ibias1 and Ibias2 can be chosen to adjust amplifier performance. For instance, the amplifier gain, input and output impedance can all be controlled by these bias currents.

A bidirectional amplifier as shown in FIG. 7 suitably includes a resistor R3 connected between Q11 and first node 50, and a resistor R4 connected between Q12 and second node 52. The impedances R3 and R4 can be used in conjunction with Q11 and Q12 to dictate a specific amplifier performance. While shown as purely real impedances in FIG. 7, these impedances may be realized as complex impedances to control amplifier gain, phase, or impedance. Bidirectional amplifier 48 may also include first and second ac-coupling capacitors C1 and C2, connected between first and second nodes 50 and 52 and first common emitter cascode arrangement 58 and second common emitter cascode arrangement 62, respectively. C1 enables Q7 and Q11 to be biased independently, and C2 has the same effect for Q9 and Q12.

In addition to adjusting amplifier bias points and impedances, impedance matching may be accomplished by using additional passive components. These passive element circuits 80 and 82 may be connected between first and second ports 54 and 56, respectively, and the other amplifier circuitry. For example, impedance matching circuitry 80 may comprise an inductor L1 and a capacitor C3, and impedance matching circuitry 82 may comprise and inductor L2 and a capacitor C4. These components may be unnecessary if the signals being amplified are low frequency.

The bases of Q8 and Q10 may be connected directly to fixed voltages, as shown in FIG. 6. Alternatively, as shown in FIG. 7, the bases of Q8 and Q10 can be connected to fixed voltages Vb3 and Vb4 via resistors R5 and R6, respectively, with capacitors C5 and C6 connected between the bases of Q8 and Q10 and a circuit common point. When properly selected, C5 and C6 allow there to be zero impedance at Q8 and Q10, providing stability over frequency. A shunt-peaking inductor L3 is shown connected in series with load resistor $R_L$, though this is not essential.

When operating in the first mode, amplification proceeds left-to-right in FIG. 7. In this mode, an input signal provided to Port 1 is coupled to first common emitter cascode arrangement 58 via AC coupling capacitor C1. First common emitter cascode arrangement 58 couples the signal to node 60, with Q11 serving as a feedback emitter follower. The signal at node 60 is coupled to node 52—and thus output Port 2—via emitter follower transistor Q12.

When operating in the second mode, amplification proceeds right-to-left in FIG. 7. In this mode, an input signal provided to Port 2 is coupled to second common emitter cascode arrangement 62 via AC coupling capacitor C2. Second common emitter cascode arrangement 62 couples the signal to node 60, with Q12 serving as a feedback emitter follower. The signal at node 60 is coupled to node 50—and thus output Port 1—via emitter follower transistor Q11.

When amplification is left-to-right, the current through Q11 sets the amplifier's input impedance, which can be further tuned with Ibias1; in this case, Ibias2 can be used to set the amplifier's output impedance. The roles of Ibias1 and Ibias2 are reversed for right-to-left amplification. It is the feedback loop formed with Q11 (for left-to-right) or Q12 (for right-to-left) that makes the bidirectional functionality possible.

Note that, though FIGS. 6 and 7 depict a single-ended amplifier, the concepts described herein are fully applicable to a differential amplifier configuration.

The embodiments of the invention described herein are exemplary and numerous modifications, variations and rearrangements can be readily envisioned to achieve substantially equivalent results, all of which are intended to be embraced within the spirit and scope of the invention as defined in the appended claims.

I claim:

1. A bidirectional amplifier, comprising,
   first and second ports;
   a first summing node connected to said first port;
   a second summing node connected to said second port;
   a first gain stage connected between said first summing node and a first node;
   a second gain stage connected between said second summing node and said first node;
   a first feedback stage connected between said first node and said first summing node;
   a second feedback stage connected between said first node and said second summing node;
   said bidirectional amplifier arranged such that, in a first mode:
   said first port is an input port and said second port is an output port;
   said first summing node produces an output which varies with the difference between a signal applied to said first port and the output of said first feedback stage;
   said first gain stage provides an output which varies with said first summing node output;
   said second feedback stage receives the output of said first gain stage; and
   said second summing node receives the output of said second feedback stage and produces an output at said second port which varies with said second feedback stage output;
   and in a second mode:
   said second port is an input port and said first port is an output port;
   said second summing node produces an output which varies with the difference between a signal applied to said second port and the output of said second feedback stage;
   said second gain stage provides an output which varies with said second summing node output;
   said first feedback stage receives the output of said second gain stage; and
   said first summing node receives the output of said first feedback stage and produces an output at said first port which varies with said first feedback stage output.

2. The bidirectional amplifier of claim 1, wherein said first gain stage comprises a first common emitter cascode arrangement and said second gain stage comprises a second common emitter cascode arrangement, and said first feedback stage comprises a first emitter follower and said second feedback stage comprises a second emitter follower, said bidirectional amplifier arranged such that, in said first mode:
   said first gain stage is enabled; and
   said first feedback stage provides feedback from the output of said first gain stage to said first summing node and said second feedback stage operates as an emitter follower stage;
   and in said second mode:
   said second gain stage is enabled; and
   said second feedback stage provides feedback from the output of said second gain stage to said second summing node and said first feedback stage operates as an emitter follower stage.

3. The bidirectional amplifier of claim 2, wherein in said first mode, said second gain stage is disabled or adjusted in-situ or during steady-state operation to meet system requirements, and in said second mode, said first stage is disabled or adjusted in-situ or during steady-state operation to meet system requirements.

4. The bidirectional amplifier of claim 3, wherein adjusting said first or second gain stage comprises varying its magnitude and/or phase.

5. The bidirectional amplifier of claim 1, wherein said first and second gain stages have associated gain transfer functions A1(s) and A2(s), respectively, and said first and second feedback stages have associated feedback transfer functions f1,2(s) and f2,1(s), respectively, wherein A1(s) and A2(s) can be identical or different, and f1,2(s) and f2,1(s) can be symmetric or asymmetric.

6. The bidirectional amplifier of claim 1, wherein said amplifier is single-ended or differential.

7. A bidirectional amplifier, comprising,
first and second ports;
a first circuit connected between said first port and a first node;
a second circuit connected between said second port and said first node, the components of said first circuit being substantially identical to the components of said second circuit, said bidirectional amplifier having a symmetrical architecture around said first node;
said first and second circuits arranged to:
in a first mode, amplify a signal applied at said first port and provide said amplified signal at said second port; and to:
in a second mode, amplify a signal applied at said second port and provide said amplified signal at said first port;
said bidirectional amplifier having associated system gain, input impedance, and output impedance characteristics, and circuitry arranged such that said system gain, input impedance, and output impedance characteristics can be designed independently of each other.

8. The bidirectional amplifier of claim 7, wherein said first and second circuits comprise:
first and second nodes coupled to said first and second ports, respectively;
first and second transistors connected in a first common emitter cascode arrangement between said first node and a third node;
third and fourth transistors connected in a second common emitter cascode arrangement between said second node and said third node;
a fifth transistor connected between said third node and said first node; and
a sixth transistor connected between said third node and said second node;
said bidirectional amplifier arranged such that:
in said first mode, said first common emitter cascode arrangement is enabled, said sixth transistor operates as an emitter follower and forms a gain stage with said first common emitter cascode arrangement and said fifth transistor operates as a feedback emitter follower, such that said bidirectional amplifier amplifies a signal applied to said first port and provides said amplified signal at said second port; and such that:
in said second mode, said second common emitter cascode arrangement is enabled, said fifth transistor operates as an emitter follower and forms a gain stage with said second common emitter cascode arrangement and said sixth transistor operates as a feedback emitter follower, such that said bidirectional amplifier amplifies a signal applied to said second port and provides said amplified signal at said first port.

9. The bidirectional amplifier of claim 8, wherein in said first mode, said second common emitter cascode arrangement is disabled or adjusted in-situ or during steady-state operation to meet system requirements, and in said second mode, said first common emitter cascode arrangement is disabled or adjusted in-situ or during steady-state operation to meet system requirements.

10. The bidirectional amplifier of claim 9, wherein adjusting said first or second common emitter cascode arrangement comprises varying its magnitude and/or phase.

11. The bidirectional amplifier of claim 8, further comprising first and second bias points coupled to said first and second common emitter cascode arrangements, respectively, said first and second bias points arranged to enable, disable, or adjust said first and second common emitter cascode arrangements according to system requirements.

12. The bidirectional amplifier of claim 8, further comprising a load resistor connected between said third node and a supply voltage.

13. The bidirectional amplifier of claim 8, further comprising;
a first resistor connected between said fifth transistor and said first node; and
a second resistor connected between said sixth transistor and said second node.

14. The bidirectional amplifier of claim 8, further comprising:
a first current source which conducts a current Ibias1 connected between said first node and a circuit common point; and
a second current source which conducts a current Ibias2 connected between said second node and said circuit common point.

15. The bidirectional amplifier of claim 14, wherein Ibias1=Ibias2.

16. The bidirectional amplifier of claim 14, wherein Ibias1≠Ibias2.

17. The bidirectional amplifier of claim 16, wherein in said first mode, Ibias1=x and Ibias2=y, and in said second mode, Ibias1=y and Ibias2=x.

18. The bidirectional amplifier of claim 14, wherein said first and second current sources are digital-to-analog converters (DAC).

19. The bidirectional amplifier of claim 11, wherein said first and second bias points are set to respective voltages with one or more digital-to-analog converters.

20. The bidirectional amplifier of claim 11, wherein said first and second bias points are set to respective voltages with first and second switches, respectively,
said first switch arranged to connect the input to said first common emitter cascode arrangement to either a circuit common point or to a first bias voltage, said first common emitter cascode arrangement enabled when said first switch connects the input to said first common emitter cascode arrangement to said bias voltage, and said first common emitter cascode arrangement disabled when said first switch connects the input to said first common emitter cascode arrangement to said circuit common point;
said second switch arranged to connect the input to said second common emitter cascode arrangement to either a circuit common point or to a second bias voltage, said second common emitter cascode arrangement enabled when said second switch connects the input to said second common emitter cascode arrangement to said bias voltage, and said second common emitter cascode arrangement disabled when said second switch connects the input to said second common emitter cascode arrangement to said circuit common point;
such that:
when said bidirectional amplifier is in said first mode, said first switch connects the input to said first common emitter cascode arrangement to said first bias voltage and said second switch connects the input to said second common emitter cascode arrangement to said circuit common point, and when said bidirectional amplifier is in said second mode, said first switch connects the input to said first common emitter cascode arrangement to said circuit common point and said second switch connects the input to said second common emitter cascode arrangement to said second bias voltage.

21. The bidirectional amplifier of claim 8, further comprising first and second ac-coupling capacitors connected between said first and second nodes and said first common emitter cascode arrangement and said second common emitter cascode arrangement, respectively.

22. The bidirectional amplifier of claim 8, further comprising impedance matching circuitry connected between said first and second ports and said first and second nodes, respectively.

23. The bidirectional amplifier of claim 8, wherein said first transistor's base is coupled to said first node and its emitter is connected to a circuit common point, and said second transistor's base is coupled to a first bias voltage and its collector is connected to said third node, the emitter of said second transistor connected to the collector of said first transistor, and wherein said third transistor's base is coupled to said second node and its emitter is connected to said circuit common point, and said fourth transistor's base is coupled to a second bias voltage and its collector is connected to said third node, the emitter of said fourth transistor connected to the collector of said third transistor.

24. The bidirectional amplifier of claim 23, further comprising:

first and second resistors connected between the bases of said second and fourth transistors and said first and second bias voltages, respectively, and first and second capacitors connected between the bases of said second and fourth transistors and said circuit common point, respectively.

25. A bidirectional amplifier, comprising:

first and second ports;

first and second nodes coupled to said first and second ports, respectively;

first and second ac-coupling capacitors connected between said first and second nodes and third and fourth nodes, respectively;

first and second transistors connected in a first common emitter cascode arrangement between said third node and a fifth node;

third and fourth transistors connected in a second common emitter cascode arrangement between said fourth node and said fifth node;

a fifth transistor connected between said fifth node and said first node;

a sixth transistor connected between said fifth node and said second node;

a first current source which conducts a current Ibias1 connected between said first node and a circuit common point;

a second current source which conducts a current Ibias2 connected between said second node and said circuit common point; and first and second bias points coupled to said third and fourth nodes, respectively;

said bidirectional amplifier arranged such that:

in said first mode, said first and second bias points are arranged to enable said first common emitter cascode arrangement and disable said second common emitter cascode arrangement, said sixth transistor operates as an emitter follower and forms a gain stage with said first common emitter cascode arrangement and said fifth transistor operates as a feedback emitter follower, such that said bidirectional amplifier amplifies a signal applied to said first port and provides said amplified signal at said second port; and such that:

in said second mode, said first and second bias points are arranged to enable said second common emitter cascode arrangement and disable said first common emitter cascode arrangement, said fifth transistor operates as an emitter follower and forms a gain stage with said second common emitter cascode arrangement and said sixth transistor operates as a feedback emitter follower, such that said bidirectional amplifier amplifies a signal applied to said second port and provides said amplified signal at said first port.

* * * * *